United States Patent
Lin et al.

(10) Patent No.: US 9,887,144 B2
(45) Date of Patent: Feb. 6, 2018

(54) RING STRUCTURE FOR CHIP PACKAGING

(75) Inventors: Wen-Yi Lin, Taipei (TW); Yu-Chih Liu, Taipei (TW); Ming-Chih Yew, Hsinchu (TW); Tsung-Shu Lin, Yonghe (TW); Bor-Rung Su, New Taipei (TW); Jing Ruei Lu, Taipei (TW); Wei-Ting Lin, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 13/227,983

(22) Filed: Sep. 8, 2011

(65) Prior Publication Data

US 2013/0062752 A1 Mar. 14, 2013

(51) Int. Cl.
*H01L 23/10* (2006.01)
*H01L 23/16* (2006.01)
*H01L 23/36* (2006.01)
*H01L 21/56* (2006.01)
*H01L 23/00* (2006.01)

(52) U.S. Cl.
CPC .............. *H01L 23/10* (2013.01); *H01L 23/16* (2013.01); *H01L 23/36* (2013.01); *H01L 21/563* (2013.01); *H01L 24/16* (2013.01); *H01L 24/32* (2013.01); *H01L 24/33* (2013.01); *H01L 2224/131* (2013.01); *H01L 2224/16225* (2013.01); *H01L 2224/29099* (2013.01); *H01L 2224/32225* (2013.01); *H01L 2224/32245* (2013.01); *H01L 2224/33181* (2013.01); *H01L 2224/73204* (2013.01); *H01L 2224/73253* (2013.01); *H01L 2924/15311* (2013.01); *H01L 2924/3511* (2013.01)

(58) Field of Classification Search
CPC ......... H01L 23/32; H01L 23/58; H01L 21/50; H01L 21/58; H01L 21/60; H05K 7/00
USPC .......................................................... 257/729
See application file for complete search history.

(56) References Cited

U.S. PATENT DOCUMENTS

| 6,020,211 | A | * | 2/2000 | Tuunanen | B03C 1/035 |
| | | | | | 210/222 |
| 6,020,221 | A | * | 2/2000 | Lim et al. | 438/125 |
| 6,191,480 | B1 | * | 2/2001 | Kastberg | H01L 23/4006 |
| | | | | | 257/692 |
| 2002/0118513 | A1 | * | 8/2002 | Koseki | H01L 23/4093 |
| | | | | | 361/709 |
| 2003/0146511 | A1 | * | 8/2003 | Zhao et al. | 257/739 |

(Continued)

OTHER PUBLICATIONS

Zhao, Jie-Hua, et al., "Analysis and Modeling Verification for Thermal-Mechanical Deformation in Flip-Chip Packages", 1998 IEEE Electronic Components and Technology Conference, pp. 336-344.

(Continued)

*Primary Examiner* — Fernando L Toledo
*Assistant Examiner* — Lawrence-Linh T Nguyen
(74) *Attorney, Agent, or Firm* — Hauptman Ham, LLP

(57) ABSTRACT

A ring structure for chip packaging comprises a frame portion adaptable to bond to a substrate and at least one corner portion. The frame portion surrounds a semiconductor chip and defines an inside opening, and the inside opening exposes a portion of a surface of the substrate. The at least one corner portion extends from a corner of the frame portion toward the chip, and the corner portion is free of a sharp corner.

20 Claims, 3 Drawing Sheets

(56) References Cited

U.S. PATENT DOCUMENTS

| | | | |
|---|---|---|---|
| 2005/0280127 A1* | 12/2005 | Zhao | H01L 23/24 257/678 |
| 2007/0069366 A1* | 3/2007 | Chang | H01L 23/16 257/700 |
| 2007/0155215 A1* | 7/2007 | Hsu | H05K 7/1053 439/331 |
| 2011/0215463 A1* | 9/2011 | Lin | H01L 23/32 257/727 |

OTHER PUBLICATIONS

Riemer, Dietrich E., "Prediction of Temperature Cycling Life for SMT Solder Joints on TCE-Mismatched Substrates", IEEE, pp. 418-425.

* cited by examiner

RING STRUCTURE FOR CHIP PACKAGING

BACKGROUND

The present disclosure relates generally to semiconductor chip packages, and more particularly to ring structures for chip packaging.

In semiconductor chip packages, where a semiconductor chip is mounted onto a substrate, the chip package may suffer from reliability issues when undergoing temperature cycling and/or during normal operation. Flip chip ball grid array, a type of chip package technology mounts the active side of the chip in an upside-down manner over the substrate and bonded to the same by means of a plurality of solder bumps attached to input/output pads thereon. Due to the inherent coefficient of thermal expansion mismatches between the chip and the chip package components, such as the substrate and underfill (an adhesive flowed between the chip and substrate), package warpage and thermal stresses are frequently induced in the chip package.

These high thermal stresses and warpage not only lead to the delamination in the low dielectric constant (low-k) interconnect layer(s) in the chip, but may also cause solder bump cracks leading to failure or degrading the long term operating reliability of the chip package. One method of reducing the warpage of the chip package is to attach a ring structure inside the package. However, even with the use of the ring structure inside the package, the package may still suffer from warpage to some degree. For example, warpage and therefore stress may still exist in a region of the chip package, such as at a central region of the package where the chip resides.

BRIEF DESCRIPTION OF THE DRAWINGS

The features, aspects, and advantages of the present disclosure will become more fully apparent from the following detailed description, appended claims, and accompanying drawings in which:

DETAILED DESCRIPTION

In the following description, numerous specific details are set forth to provide a thorough understanding of the present disclosure. However, one having an ordinary skill in the art will recognize that the disclosure can be practiced without these specific details. In some instances, well-known structures have not been described in detail to avoid unnecessarily obscuring the present disclosure.

Reference will now be made in detail to the present disclosures, examples of which are illustrated in the accompanying drawings.

Figure 1:
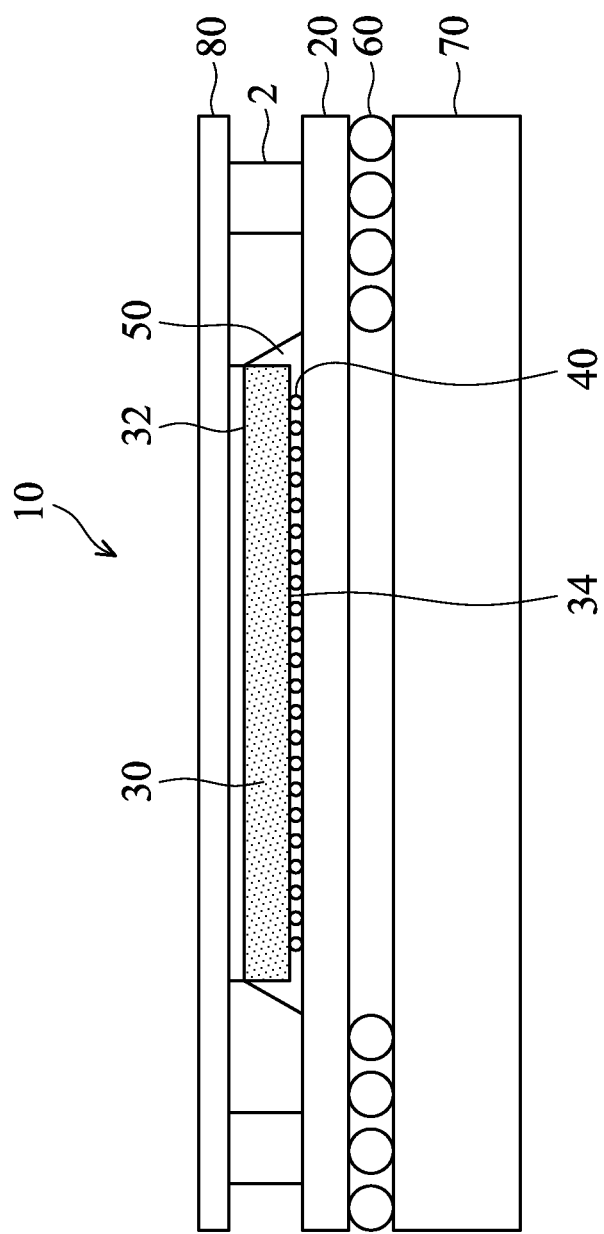
FIG. 1 is a cross-sectional view of a semi-finished flip chip ball grid array package having a ring structure mounted to a substrate.

FIG. 1 is a cross-sectional view of a semi-finished flip chip ball grid array (FCBGA) package 10 having a ring structure 2 mounted to a substrate 20. For convenience of illustration and ease of understanding, the features and dimensions of the FCBGA package 10 have been exaggerated in some aspects. However, one skilled in the art will appreciate that, in an actual device, these features have relative dimensions that are different from those suggested in FIG. 1. FCBGA package 10 includes a chip 30 having an upper surface 32 and a lower surface 34 opposite the upper surface 32. A set of solder bumps 40 is connected to contact pads (not shown) on the lower surface 34 of chip 30. The combination of the chip 30 and the solder bumps 40 are commonly known as and referred to as a flip chip. Chip 30 is secured to a first substrate 20 underlying chip 30. Solder bumps 40 are attached to contact pads (not shown) on an upper surface of first substrate 20. An underfill 50 may be filled between chip 30 and first substrate 20 to stiffen the FCBGA package 10 and further protect chip 30 from flexural damage. A set of solder balls 60 may be secured to contact pads (not shown) on a lower surface of first substrate 20. Solder balls 60 may also be secured to contact pads (not shown) on a second substrate 70. The second substrate 70 may be a printed wire board (also sometimes called a printed circuit board) or may be a multilayer module known to those skilled in the art.

Figure 2:
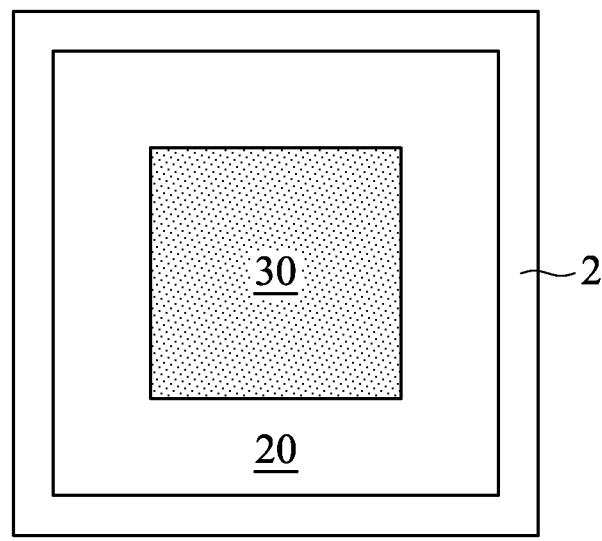
FIG. 2 is a top plan view of a ring structure.

The FCBGA package 10 may also include a heat spreader 80 and ring structure 2 for preventing excess warpage of the package. Heat spreader 80 is mounted on top of chip 30 to dissipate heat generated by chip 30 and to counter-balance the forces exerted by the thermal expansion mismatches between at least the chip 30 and the first substrate 20. Ring structure 2 is mounted between first substrate 20 and heat spreader 80 by means of adhesives (not shown). A top plan view of ring structure 2 is shown in FIG. 2. However, as discussed above, even with the use of ring structure 2, the package may still suffer from warpage to some degree.

Figure 3:
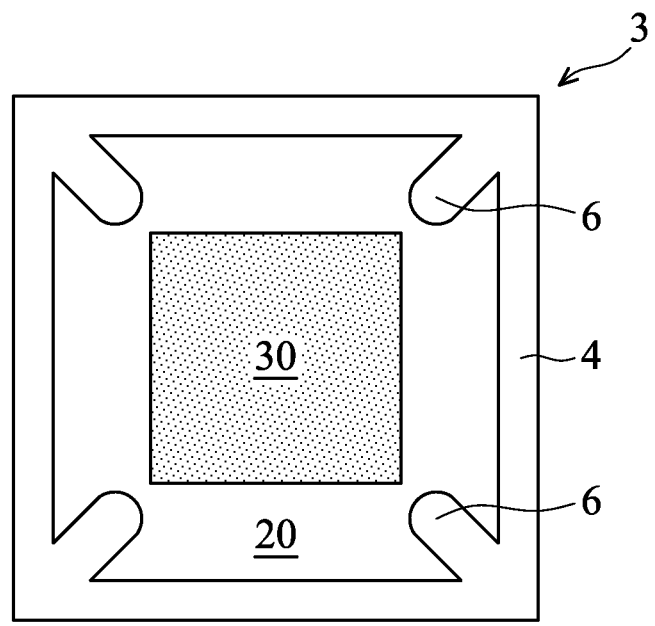
FIG. 3 is a top plan view of a ring structure according to a first embodiment of the present disclosure.

The various embodiments of ring structures of the present disclosure offer a degree of rigidity against warping and twisting higher than that of ring structure 2. FIG. 3 is a top plan view of a ring structure 3 according to a first embodiment of the present disclosure. Ring structure 3 preferably has as much surface area mounted to first substrate 20 as possible, so that the ring structure 3 can aid, to as great an extent as possible, in structurally reinforcing the FCBGA package 10 against twisting and warping. The dimension of the ring structure 3 is largely determined by the size of the package and is dependent on at least the size and shape of first substrate 20. Ring structure 3 may have a thickness of from about 500 to about 1,000 microns, according to one embodiment.

Ring structure 3 has a rigid, planar frame portion 4 for bonding on one side to first substrate 20, and on the other side to a heat dissipating element such as, for example, heat spreader 80. In some embodiments, frame portion 4 is formed of a rigid material. In at least one embodiment, frame portion 4 comprises a conductive material, metal, copper, tungsten, aluminum, polysilicon, silicide, ceramic, a material that is stronger than an adjacent dielectric material, alloys thereof, or combinations thereof. However, one skilled in the art will understand that frame portion 4 may be made from any material, which provides a sufficient degree of rigidity to the chip package against warpage and twisting.

The frame portion 4 of ring structure 3 has an opening therein for surrounding an integrated circuit device, such as chip 30. It is appreciated that the size of the opening and therefore the ring structure 3 is dependent upon the size of the integrated circuit device (chip), which ring structure 3 must receive and surround. In some embodiments, the opening and ring structure 3 are sized so as to maximize the surface area of ring structure 3 that can be mounted to first substrate 20, so as to reduce twisting and warping as much as possible.

Referring back to FIG. 3, the frame portion 4 includes a plurality of corner portions 6. Corner portions 6 may be elongated to allow ring structure 3 to have a greater amount of surface area mounted to first substrate 20, which improves the structural strength of the chip package. Frame portion 4 and corner portions 6 reduce warpage due to the thermal expansion mismatches that may exist between at least the chip 30 and components of FCBGA package 10. In at least one embodiment, as shown in FIG. 3, the frame portion 4 has a plurality of corner portions 6 formed at the corners of frame portion 4. In some embodiments, the ends of the corner portions 6 are slightly rounded and therefore free of a sharp corner. The slightly rounded ends may help reduce the stress that exists at the point of contact between the corner portions 6 and the substrate, thereby helping reduce the chip package warpage.

In some embodiments, corner portions 6 are formed of a rigid material. In at least one embodiment, corner portions 6 comprise a conductive material, metal, copper, tungsten, aluminum, polysilicon, silicide, ceramic, a material that is stronger than an adjacent dielectric material, alloys thereof, or combinations thereof. However, one skilled in the art will understand that corner portions 6 may be made from any material, which provides a sufficient degree of rigidity to the chip package against warpage and twisting. In some embodiments, one or more of corner portions 6 comprises a same material as the frame portion 4. In other embodiments, one or more of corner portions 6 comprises a different material than the frame portion 4.

Figure 4:
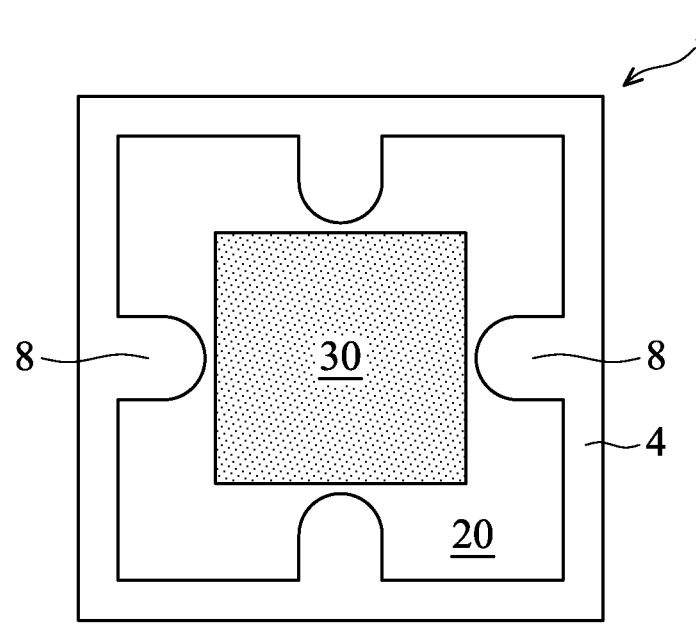
FIG. 4 is a top plan view of a ring structure according to a second embodiment of the present disclosure.

In another embodiment, as shown in FIG. 4, the frame portion 4 has a plurality of mid-section portions 8 formed at the mid-sections of the frame portion 4. In another embodiment, as depicted in FIG. 5, the frame portion 4 has a plurality of corner portions 6 formed at the corners of the frame portion 4 and a plurality of mid-section portions 8 formed at the mid-sections of the frame portion 4.

Figure 5:
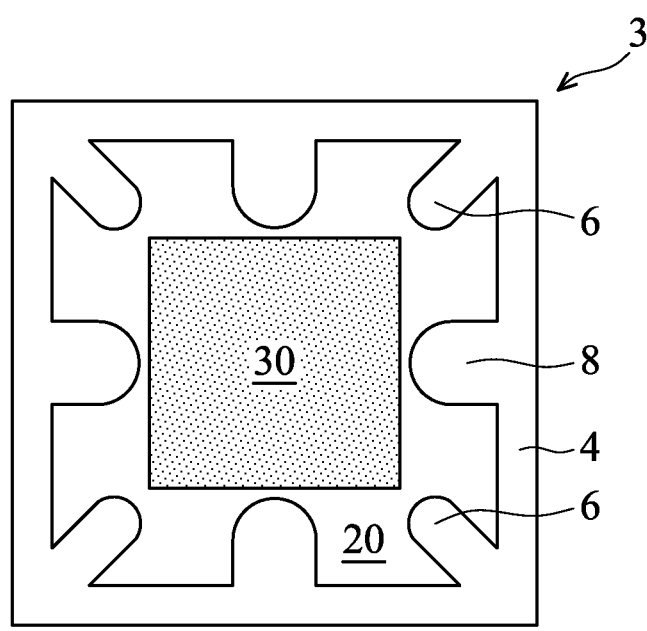
FIG. 5 is a top plan view of a ring structure according to a third embodiment of the present disclosure.

In the embodiments depicted in FIGS. 3-5, the frame portion 4 and the corner portions 6 and mid-section portions 8 reduce warpage and twisting of the chip package by offering reinforcement thereto. The embodiments of the ring structure of the present disclosure reinforce the chip package against twisting and warping thereby improving the performance of the package when compared to integrated circuit packages using conventional ring structures. It is understood that there are many different variations of the ring structure in accordance with aspects of the present disclosure, of which the figures necessarily show just a few. The ring structures of the present disclosure were applied to a FCBGA chip package for the purposes of illustrating embodiments and advantages of the present disclosure; however, they are not limited to FCBGA chip packages. Embodiments of the present disclosure can apply equally to any type of chip package.

According to one embodiment, a ring structure for chip packaging comprises a frame portion adaptable to bond to a substrate. The frame portion surrounds a semiconductor chip and defines an inside opening, and the inside opening exposes a portion of a surface of the substrate. At least one corner portion extends from the frame portion toward the chip, and the ends of the corner portion is free of a sharp corner.

According to another embodiment, a ring structure for chip packaging comprises a frame portion adaptable to bond to a substrate. The frame portion surrounds a semiconductor chip and defines an inside opening, and the inside opening exposes a portion of a surface of the substrate. At least one mid-section portion extends from the frame portion toward the chip, and the mid-section portion is free of a sharp corner.

According to yet another embodiment, an integrated circuit structure comprises a substrate, a semiconductor chip, and a ring structure. The ring structure has a frame portion adaptable to bond to the substrate. The frame portion surrounds a semiconductor chip and defines an inside opening, and the inside opening exposes a portion of a surface of the substrate. At least one corner portion extends from the frame portion toward the chip, and the corner portion is free of a sharp corner.

In the preceding detailed description, the present disclosure is described with reference to specifically exemplary embodiments thereof. It will, however, be evident that various modifications, structures, processes, and changes may be made thereto without departing from the broader spirit and scope of the present disclosure, as set forth in the claims. The specification and drawings are, accordingly, to be regarded as illustrative and not restrictive. It is understood that the present disclosure is capable of using various other combinations and environments and is capable of changes or modifications within the scope of the inventive concept as expressed herein.

What is claimed is:

1. A ring structure for chip packaging, comprising:
   a frame portion adaptable to bond to a substrate, the frame portion surrounding a semiconductor chip and defining an inside opening, the inside opening exposing a portion of a surface of the substrate;
   at least one corner portion, the at least one corner portion extending from a corresponding corner of the frame portion toward the semiconductor chip, and an end of each corner portion of the at least one corner portion being a rounded end, wherein the at least one corner portion comprises a different material than the frame portion; and
   at least one mid-section portion of the frame portion, wherein the at least one mid-section portion extends from a corresponding sidewall of the frame portion toward the semiconductor chip, and the at least one mid-section portion has a same shape as the at least one corner portion.

2. The ring structure of claim 1, wherein the at least one corner portion comprises conductive material, metal, copper, tungsten, aluminum, polysilicon, silicide, ceramic, alloys thereof, or combinations thereof.

3. The ring structure of claim 1, wherein the at least one corner portion is a plurality of corner portions.

4. The ring structure of claim 3, wherein a corner portion of the plurality of corner portions is located adjacent to each corresponding corner of the frame portion.

5. The ring structure of claim 1, wherein the at least one mid-section portion is a plurality of mid-section portions.

6. The ring structure of claim 5, wherein a mid-section portion of the plurality of mid-sections portions is located adjacent to each sidewall of the frame portion.

7. The ring structure of claim 1, wherein the at least one corner portion includes a first corner portion and a second corner portion, and the at least one mid-section portion is between the first corner portion and the second corner portion.

8. The ring structure of claim 1, wherein an end of each mid-section portion of the at least one mid-section portion is rounded.

9. The ring structure of claim 1, wherein the at least one mid-section portion comprises a different material from the frame portion.

10. The ring structure of claim 1, wherein the at least one mid-section portion extends from the corresponding sidewall located between adjacent corner portions of the at least one corner portion.

11. A ring structure for chip packaging, comprising:
a frame portion adaptable to bond to a substrate, the frame portion having an inside opening for surrounding a semiconductor chip, the inside opening exposing a portion of a surface of the substrate; and
at least one mid-section portion, the at least one mid-section portion extending from a corresponding sidewall of the frame portion toward the inside opening, and an end of each mid-section portion of the at least one mid-section portion being a rounded end, wherein the at least one mid-section portion is perpendicular to the corresponding sidewall of the frame portion, and the at least one mid-section portion comprises a different material as the frame portion.

12. The ring structure of claim 11, wherein the at least one mid-section portion comprises conductive material, metal, copper, tungsten, aluminum, polysilicon, silicide, ceramic, alloys thereof, or combinations thereof.

13. The ring structure of claim 11, wherein the frame portion has a thickness ranging from 500 μm to 1000 μm.

14. The ring structure of claim 11, further comprising a plurality of corner portions, wherein each corner portion of the plurality of corner portions extends from a corresponding corner of the inside opening of the frame portion.

15. The ring structure of claim 14, wherein the at least one mid-section portion has a same shape as at least one corner portion of the plurality of corner portions.

16. An integrated circuit structure, comprising:
a substrate;
a semiconductor chip; and
a ring structure having:
a frame portion adaptable to bond to the substrate, the frame portion surrounding the chip and defining an inside opening, the inside opening exposing a portion of a surface of the substrate
at least one corner portion, the corner portion extending from a first location of the inside opening of the frame portion towards the chip, and an end of each corner portion of the corner portion being a rounded end, wherein the at least one corner portion comprises a different material as the frame portion; and
at least one mid-section portion, the at least one mid-section portion extending from a second location of the frame portion toward the inside opening, an end of each mid-section portion of the at least one mid-section portion being a rounded end, wherein the at least one mid-section portion is perpendicular to the corresponding sidewall of the frame portion, and the first location is spaced apart from the second location.

17. The integrated circuit structure of claim 16, wherein the at least one corner portion comprises conductive material, metal, copper, tungsten, aluminum, polysilicon, silicide, ceramic, alloys thereof, or combinations thereof.

18. The integrated circuit structure of claim 16, wherein the frame portion has a thickness ranging from 500 μm to 1000 μm.

19. The ring structure of claim 16, wherein the at least one mid-section portion comprises a different material from the frame portion.

20. The ring structure of claim 16, wherein the at least one mid-section portion has a same shape as the at least one corner portion.

* * * * *